United States Patent
Kim (10) Patent No.: US 8,835,922 B2
(45) Date of Patent: Sep. 16, 2014

(54) MONITORING PAD AND SEMICONDUCTOR DEVICE INCLUDING THE SAME

(75) Inventor: Byung-Chul Kim, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/566,117

(22) Filed: Aug. 3, 2012

(65) Prior Publication Data

US 2013/0037803 A1    Feb. 14, 2013

(30) Foreign Application Priority Data

Aug. 10, 2011    (KR) .................. 10-2011-0079728

(51) Int. Cl.
*H01L 21/66*    (2006.01)
*H01L 23/525*    (2006.01)

(52) U.S. Cl.
CPC ............ *H01L 22/32* (2013.01); *H01L 23/5258* (2013.01); *H01L 23/5252* (2013.01)
USPC .................. 257/48; 438/14; 438/15; 438/17; 438/18; 438/121

(58) Field of Classification Search
USPC ............. 257/48, E21.529, E23.002, 737, 666
See application file for complete search history.

(56) References Cited

U.S. PATENT DOCUMENTS

2002/0125569 A1*    9/2002    Fukuda et al. ................. 257/737
2004/0065944 A1*    4/2004    Shibata .......................... 257/666

FOREIGN PATENT DOCUMENTS

| JP | 2004-134459 | 4/2004 |
| KR | 10-0175022 B1 | 11/1998 |
| KR | 10-1999-0085653 A | 12/1999 |
| KR | 10-2004-0032039 A | 4/2004 |
| KR | 10-2010-0106152 A | 10/2010 |

\* cited by examiner

*Primary Examiner* — Chuong A Luu
*Assistant Examiner* — Rodolfo Fortich
(74) *Attorney, Agent, or Firm* — Muir Patent Consulting, PLLC (57)    ABSTRACT

A method of manufacturing a semiconductor device and a semiconductor device package are disclosed. A method of manufacturing a semiconductor device comprises the steps of testing the semiconductor device using at least a first monitoring pad connected to an internal circuit of the semiconductor device via at least a first fuse circuit; after testing the semiconductor device, electrically disconnecting the first monitoring pad from the internal circuit by opening the first fuse circuit; and after testing of the semiconductor device, electrically connecting at least a first auxiliary pad to the first monitoring pad with at least a first connecting terminal, wherein the first auxiliary pad is connected, through at least a first conductive line, to at least a first power pad of the semiconductor device.

13 Claims, 6 Drawing Sheets

MONITORING PAD AND SEMICONDUCTOR DEVICE INCLUDING THE SAME

CROSS-REFERENCE TO RELATED APPLICATION

This application claims priority under 35 U.S.C. §119 to Korean Patent Application No. 10-2011-0079728 filed on Aug. 10, 2011, the disclosure of which is hereby incorporated by reference in its entirety.

BACKGROUND

Embodiments of the present disclosure relate to a semiconductor device, and more particularly to a semiconductor device including a monitoring pad.

SUMMARY

Embodiments of the present disclosure provide a monitoring pad that is used to test electrical characteristics of an internal circuit before a packaging step, and is used as a power pad after a packaging step.

A method of manufacturing a semiconductor device comprises the steps of testing the semiconductor device using at least a first monitoring pad connected to an internal circuit of the semiconductor device; after testing the semiconductor device, electrically disconnecting the first monitoring pad from the internal circuit; and after testing of the semiconductor device, electrically connecting at least a first auxiliary pad to the first monitoring pad with at least a first connecting terminal, wherein the first auxiliary pad is connected, through at least a first conductive line, to at least a first power pad of the semiconductor device.

A method of manufacturing a semiconductor device comprises the steps of testing the semiconductor device using at least a first monitoring pad electrically connected to an internal circuit of the semiconductor device via at least a first fuse circuit; after testing the semiconductor device, electrically disconnecting the first monitoring pad from the internal circuit by opening the first fuse circuit; and after testing the semiconductor device, electrically connecting at least a first auxiliary pad to the first monitoring pad with at least a first conductive connector, wherein the first auxiliary pad is connected, through at least a first conductive line, to at least a first power pad of the semiconductor device.

An exemplary semiconductor package comprises a package substrate and a semiconductor device disposed on the package substrate. The semiconductor device comprises at least a first power pad; at least a first terminal connecting at least a first monitoring pad to at least a first auxiliary pad; at least a first conductive line connecting the first auxiliary pad to the first power pad; and at least a first open fuse circuit, wherein a first terminal of the first open fuse circuit is connected to an internal circuit of the semiconductor device and a second terminal of the open fuse circuit is connected to the first monitoring pad.

BRIEF DESCRIPTION OF THE DRAWINGS

The above and other aspects and features of the disclosure will become apparent by describing in detail exemplary embodiments thereof with reference to the attached drawings, in which.

DETAILED DESCRIPTION OF THE EMBODIMENTS

Various example embodiments will now be described more fully hereinafter with reference to the accompanying drawings, in which exemplary embodiments are shown. The present invention may, however, be embodied in many different forms and should not be construed as limited to the example embodiments set forth herein. That is, these example embodiments are just that—examples—and many implementations and variations are possible that do not require the various details herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative size of layers and regions may be exaggerated for clarity. Like numerals refer to like elements throughout.

The terminology used herein is for the purpose of describing particular embodiments only and is not intended to limit the invention. As used herein, the singular terms "a," "an" and "the" should not exclude the plural forms as well, unless the context clearly indicates otherwise. As used herein, the term "and/or" includes any and all combinations of one or more of the associated listed items. It will be understood that when an element or a layer is referred to as being "on," "connected to" or "coupled to" another element or layer, it may be directly on, connected to, or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between;" "adjacent" versus "directly adjacent," etc.).

It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Example embodiments should not be construed as limited to those shown in the views, but include modifications in configuration formed on the basis of, for example, manufacturing processes. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and their shapes are not intended to limit the scope of the present disclosure.

It will be also understood that although the terms first, second, third etc. may be used herein to describe various elements, components, regions, layers and/or sections, these elements, components, regions, layers, and/or sections should not be limited by these terms. Unless otherwise indicated, these terms are only used to distinguish one element, component, region, layer, or section from another element, components, region, layer, or section. Thus, a first element, components, region, layer, or section in some embodiments could be termed a second element, components, region, layer, or section in other embodiments, and, similarly, a second element, components, region, layer, or section could be termed a first element, components, region, layer, or section without departing from the teachings of the disclosure. Exemplary embodiments explained and illustrated herein may include their complementary counterparts.

Locational terms, such as "beneath," "below," "lower," "above," "upper" and the like, may be used herein for ease of description to describe one element or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the locational descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application and will not be interpreted in an idealized or overly formal sense unless expressly so defined herein.

It should also be noted that in some alternative implementations, the functions/acts described may occur out of the order noted in the figures or the specification unless expressly stated otherwise. For example, two figures shown in succession may in fact be executed substantially concurrently or may sometimes be executed in the reverse order, depending upon the steps, functionality, or acts involved.

Hereinafter, example embodiments will be explained in detail with reference to the accompanying drawings.

In the process of fabricating semiconductor devices using a semiconductor fabrication process, it may be necessary to test electrical characteristics of an internal circuit included in the semiconductor devices before packaging the semiconductor devices. A semiconductor device may include monitoring pads for testing electrical characteristics of an internal circuit included in the semiconductor device before the device is packaged. Because the monitoring pads are not used to test the electrical characteristics of the internal circuit after packaging, the monitoring pads may not be wire bonded during the packaging step. Particularly, in the case of a flip-chip design, wire bonding may not be performed on the monitoring pads and only bumps may be formed on the chip. There may be a problem in arranging power lines during the routing of a printed circuit board (PCB) with conventional monitoring pads.

Figure 1:
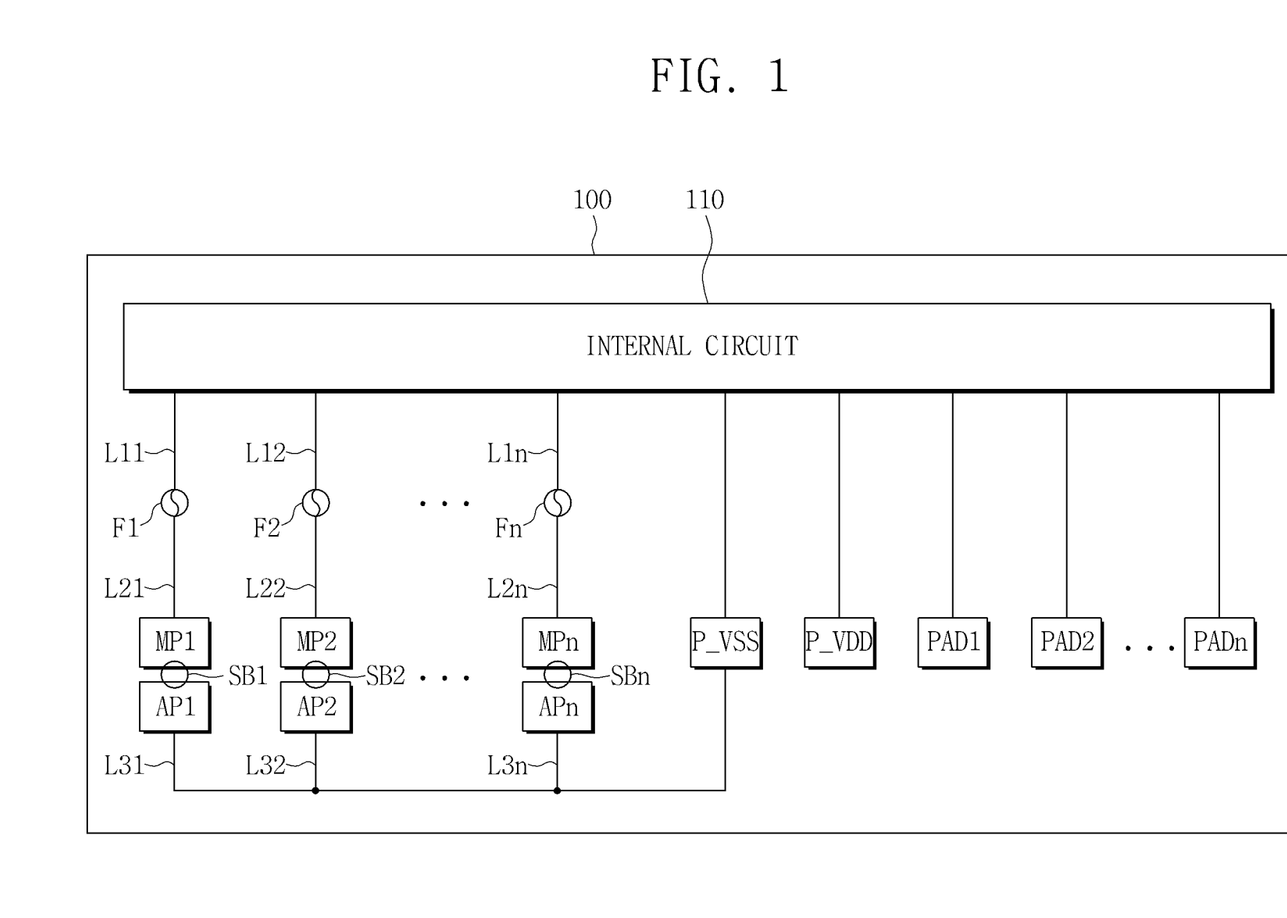
FIG. 1 is a schematic circuit diagram illustrating a semiconductor device in accordance with an exemplary embodiment.

FIG. 1 is a schematic circuit diagram illustrating a semiconductor device 100 in accordance with some embodiments.

Referring to FIG. 1, the semiconductor device 100 includes an internal circuit 110, a power pad P_VSS, fuse circuits F1 to Fn, monitoring pads MP1 to MPn, auxiliary pads AP1 to APn, and connecting terminals SB1 to SBn.

Each of the fuse circuits F1 to Fn has a first terminal electrically connected to the internal circuit 110 through a first conductive line L11, L12, ..., or L1n. Each of the monitoring pads MP1 to MPn is electrically connected to a second terminal of each of the fuse circuits F1 to Fn through a second conductive line L21, L22, ..., or L2n, and may be used to test electrical characteristics of the internal circuit 110 before the semiconductor device 100 is packaged. The auxiliary pads AP1 to APn are electrically connected to the power pad P_VSS through a third conductive line L31, L32, ..., L3n. The connecting terminals SB1 to SBn electrically connect each of the monitoring pads MP1 to MPn to a respective one of the auxiliary pads AP1 to APn.

The fuse circuits F1 to Fn may be cut off, and the monitoring pads MP1 to MPn may be electrically disconnected from the internal circuit 110 during the packaging step of a semiconductor process.

In the example embodiment of FIG. 1, the power pad P_VSS may be a ground pad to which a low supply voltage VSS is applied.

The semiconductor device 100 of FIG. 1 may further include a power pad P_VDD, electrically connected to the internal circuit 110, to which a high supply voltage VDD is applied, and pads PAD1 to PADn where signals are input or output.

The connecting terminal SB1 to SBn may be a conductive connector, and may be formed as a conductive bump, a solder ball, a conductive spacer, a conductive plating material, or the like.

In the example embodiment of FIG. 1, the fuse circuits F1 to Fn may be laser fuse circuits that are cut off by a laser means. For example, after the semiconductor device 100 has been tested, and before it is packaged, the fuse circuits F1 to Fn may be subject to a laser that provides an amount of current that is higher than the resistance and may be lower than the breaking capacity of the fuse circuits F1 to Fn. The fuse circuits F1 to Fn may interrupt the current from the laser and open the circuit, meaning that the internal circuit 110 is no longer electrically connected to the monitoring pads MP1 to MPn. The auxiliary pads AP1 to APn, however, may still be electrically connected to the power pad P_VSS.

In one embodiment, the monitoring pads MP1 to MPn and the auxiliary ads AP1 to APn are formed at the same time. For example, the monitoring pads MP1 to MPn and the auxiliary pads AP1 to APn may be formed during a manufacturing process of disposing a pad metal layer on a semiconductor chip of the semiconductor device. In some embodiments, the monitoring pads MP1 to MPn and the auxiliary pads AP1 to APn are formed at the same vertical of the semiconductor device. In some embodiments, the monitoring pads MP1 to MPn and the auxiliary pads AP1 to APn are formed of the same material.

Figure 2:
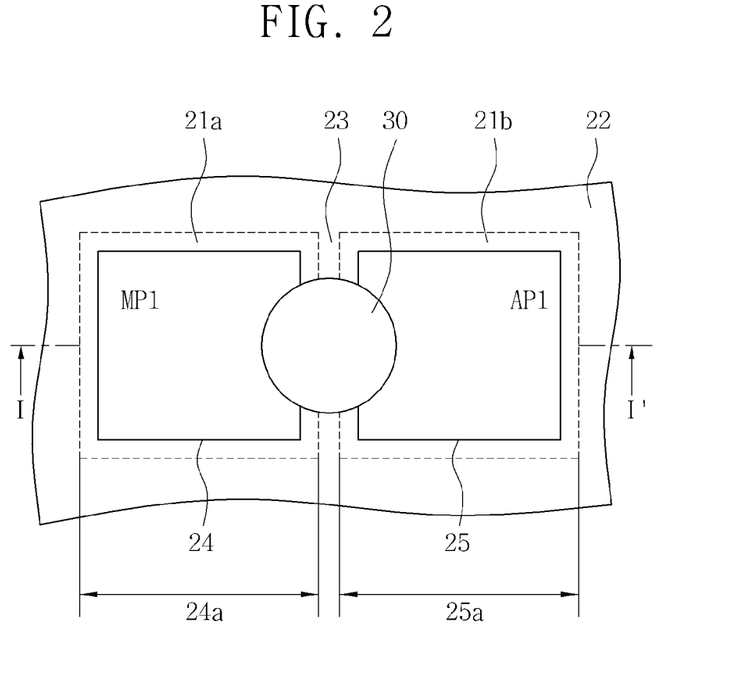
FIG. 2 is a plan view illustrating an exemplary embodiment of a monitoring pad included in the semiconductor device of FIG. 1.
Figure 3:
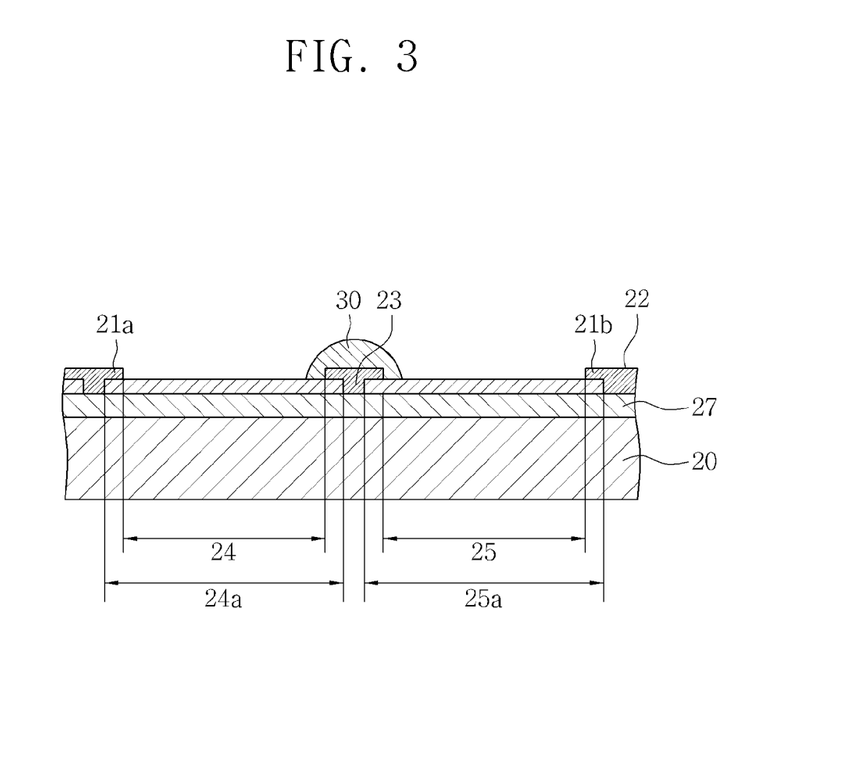
FIG. 3 is a cross-sectional view illustrating an exemplary embodiment of a monitoring pad included in the semiconductor device of FIG. 1.

FIG. 2 is a plan view illustrating an embodiment of a monitoring pad included in the semiconductor device 100 of FIG. 1, and FIG. 3 is a cross-sectional view of the monitoring pad shown in FIG. 2, taken along a line I-I'.

Referring to FIG. 2 and FIG. 3, an inter-layer insulating film 27 is formed on a semiconductor substrate 20. In some embodiments, the inter-layer insulating film 27 may comprise a dielectric material or another insulating material. A surface-protecting film 22 is formed on the inter-layer insulating film 27. In some embodiments, the surface-protecting film 22 may be a mold or an encapsulant. For example, the surface-protecting film 22 may be an epoxy molding compound (EMC) or an under-fill material. In other embodiments, the surface-protecting film 22 may be an insulating material or a passivation layer. The surface-protecting film 22 is not limited to the examples described herein.

In the surface-protecting film 22, an opening 24 of the monitoring pad MP1 and an opening 25 of the auxiliary pad AP1 are formed. Portions 21a, 21b and 23 of the surface-protecting film 22 represent regions where the openings of the monitoring pad MP1 and the auxiliary pad AP1 are not formed. Portions 24a and 25a represent regions at which the monitoring pad MP1 and the auxiliary pad AP1 are actually formed. The region 24a of the monitoring pad MP1 and the region 25a of the auxiliary pad AP1 may be electrically disconnected from each other by the surface-protecting film 22 before the semiconductor device 100 is packaged.

A connecting terminal 30 may be formed during the packaging step such that a first portion of the connecting terminal 30 is electrically connected to the monitoring pad MP1 and a second portion of the connecting terminal 30 is electrically connected to the auxiliary pad AP1. In some embodiments, a first side or a first segment of the connecting terminal 30 is electrically connected to the monitoring pad MP1 and a second side or a second segment of the connecting terminal 30 is electrically connected to the auxiliary pad AP1. The connecting terminal 30 may be formed such that a first portion overlaps with the region 24a of the monitoring pad and a second portion overlaps with a region 25a of the auxiliary pad. In some embodiments, a center portion or center segment of the connecting terminal 30 may be disposed over a portion of the surface-protecting film (i.e. portion 23).

In the embodiment described above, the monitoring pad MP1 and the auxiliary pad AP1 are electrically disconnected from each other before the packaging step, but may be connected to each other by the connecting terminal 30 during the packaging step.

Figure 4:
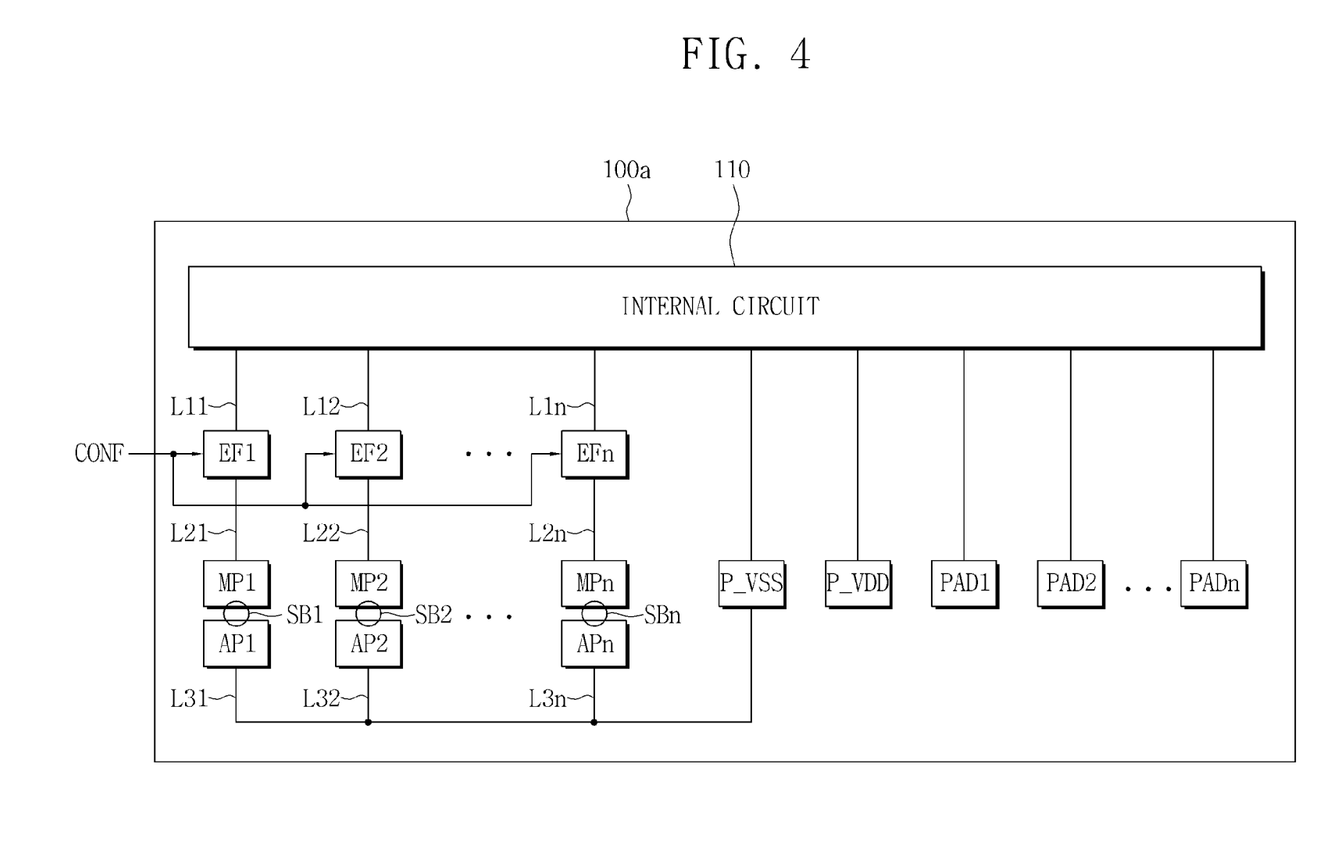
FIG. 4 is a schematic circuit diagram illustrating a semiconductor device in accordance with an exemplary embodiment.

FIG. 4 is a schematic circuit diagram illustrating a semiconductor device 100a in accordance with an exemplary embodiment.

Referring to FIG. 4, the semiconductor device 100a includes an internal circuit 110, a power pad P_VSS, electric fuse circuits EF1 to EFn, monitoring pads MP1 to MPn, auxiliary pads AP1 to APn, and connecting terminals SB1 to SBn.

Each of the electric fuse circuits EF1 to EFn has a first terminal electrically connected to the internal circuit 110 through a first conductive line L11, L12, ..., or L1n. Each of the monitoring pads MP1 to MPn is electrically connected to a second terminal of a respective one of the electric fuse circuits EF1 to EFn through a second conductive line L21, L22, ..., or L2n, and is used to test electrical characteristics of the internal circuit 110 before the semiconductor device 100a is packaged. The auxiliary pads AP1 to APn are electrically connected to the power pad P_VSS through a third conductive line L31, L32, ..., L3n. The connecting terminals SB1 to SBn electrically connect each of the monitoring pads MP1 to MPn to a respective one of the auxiliary pads AP1 to APn.

The electric fuse circuits EF1 to EFn may be cut off in response to a fuse control signal CONF. The electric fuse circuits EF1 to EFn may receive a fuse control signal CONF that blows the respective fuses in the fuse circuits EF1 to EFn after the semiconductor device 100a is tested and before the semiconductor device 100a is packaged. In response to the fuse control signal CONF, the electric fuse circuits EF1 to EFn may be open. The monitoring pads MP1 to MPn may be electrically disconnected from the internal circuit 110 during the packaging step of a semiconductor process and may remain disconnected in the resulting product. The monitoring pads MP1 to MPn and the auxiliary pads AP1 to APn of this embodiment may be similar or the same as the monitoring pads MP1 to MPn and the auxiliary pads AP1 to APn described above with respect to FIGS. 2 and 3.

In the example embodiment of FIG. 4, the power pad P_VSS may be a ground pad to which a low supply voltage VSS is applied.

The semiconductor device 100a of FIG. 4 may further include a power pad P_VDD, electrically connected to the internal circuit 110, to which a high supply voltage VDD is applied, and pads PAD1 to PADn where signals are input or output.

Each connecting terminal SB1 to SBn may be a conductive bump, a solder ball, a conductive spacer, or the like. The connecting terminals SB1 to SBn may be the same types of terminals as connecting terminal 30 of FIGS. 2 and 3.

Figure 5:
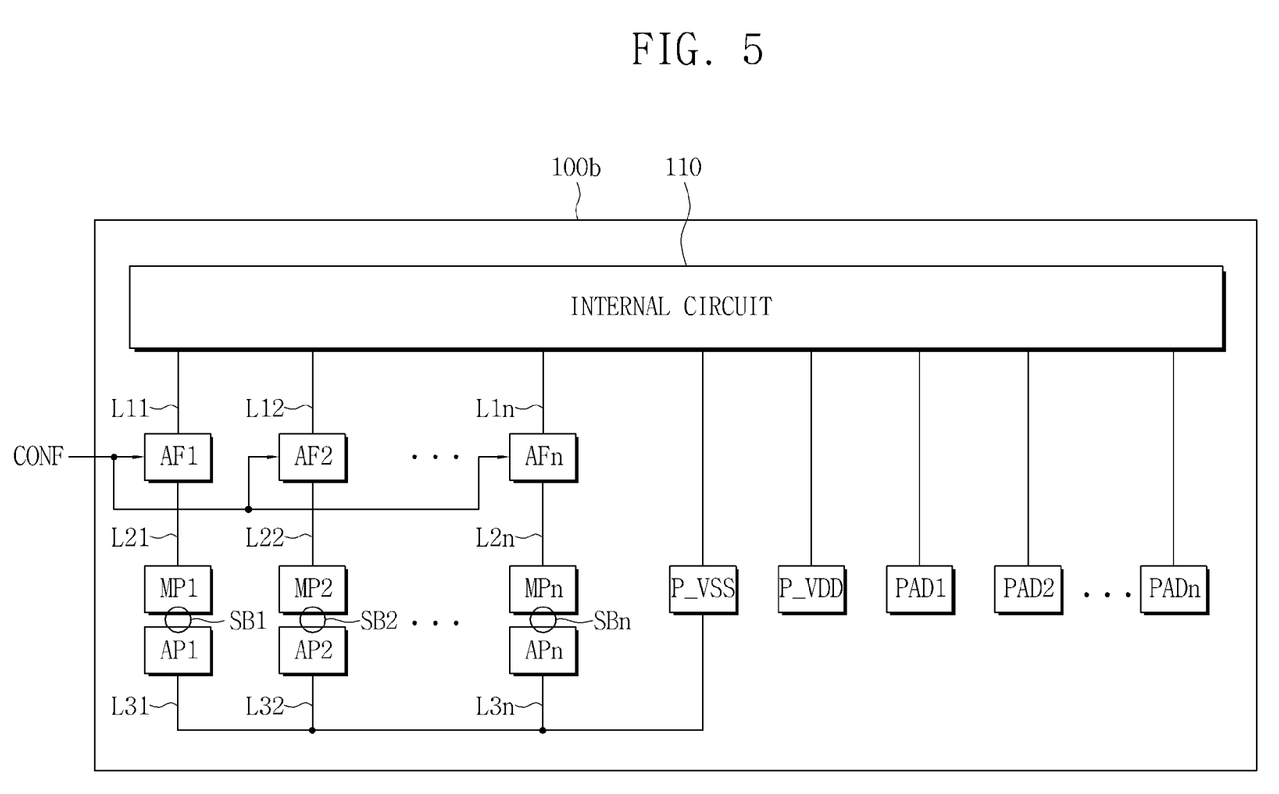
FIG. 5 is a schematic circuit diagram illustrating a semiconductor device in accordance with an exemplary embodiment.

FIG. 5 is a schematic circuit diagram illustrating a semiconductor device 100b in accordance with an exemplary embodiment.

Referring to FIG. 5, the semiconductor device 100a includes an internal circuit 110, a power pad P_VSS, anti-fuse circuits AF1 to AFn, monitoring pads MP1 to MPn, auxiliary pads AP1 to APn, and connecting terminals SB1 to SBn.

Each of the anti-fuse circuits AF1 to AFn has a first terminal electrically connected to the internal circuit 110 through a first conductive line L11, L12, ..., or L1n. Each of the monitoring pads MP1 to MPn is electrically connected to a second terminal of a respective one of the anti-fuse circuits AF1 to AFn through a second conductive line L21, L22, ..., or L2n, and is used to test electrical characteristics of the internal circuit 110 before a packaging step. The auxiliary pads AP1 to APn are electrically connected to the power pad P_VSS through a third conductive line L31, L32, ..., L3n. The connecting terminals SB1 to SBn electrically connect each of the monitoring pads MP1 to MPn to a respective one of the auxiliary pads AP1 to APn.

Before the semiconductor device 100b is tested, the anti-fuse circuit may receive a fuse control signal CONF that closes the circuit by 'growing' a conductive via. For example, an exemplary anti-fuse circuit AF1 may include two metal layers surrounding a layer of non-conductive, amorphous silicon. When the fuse control signal CONF is applied before the device 100b is tested, the amorphous silicon may be turned into a conductive polysilicon. The anti-fuse circuits AF1 to AFn may also receive a fuse control signal CONF that blows the respective fuses in the anti-fuse circuits AF1 to AFn after the semiconductor device 100b is tested and before the semiconductor device 100b is packaged. In response to the fuse control signal CONF received after the device 100b is tested, the anti-fuse circuits AF1 to AFn may be open. The monitoring pads MP1 to MPn may be electrically disconnected from the internal circuit 110 during the packaging step of a semiconductor process. The monitoring pads MP1 to MPn and the auxiliary pads AP1 to APn of this embodiment may be similar or the same as the monitoring pads MP1 to MPn and the auxiliary pads AP1 to APn described above with respect to FIGS. 2 and 3.

In the example embodiment of FIG. 5, the power pad P_VSS may be a ground pad to which a low supply voltage VSS is applied.

The semiconductor device 100b of FIG. 5 may further include a power pad P_VDD, electrically connected to the internal circuit 110, to which a high supply voltage VDD is applied, and pads PAD1 to PADn where signals are input or output.

The connecting terminal SB1 to SBn may be a conductive bump, a solder ball, a conductive spacer, or the like. The connecting terminals SB1 to SBn may be the same types of terminals as connecting terminals 30 of FIGS. 2 and 3.

Figure 6:
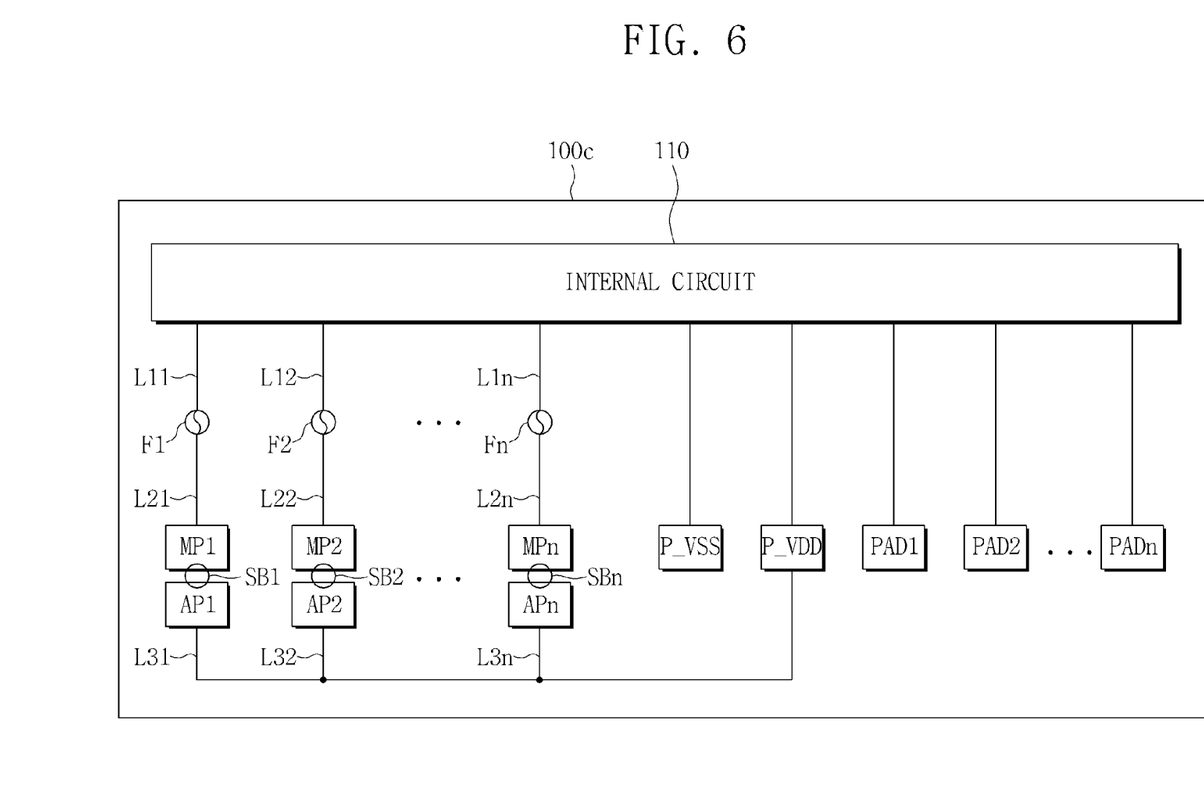
FIG. 6 is a schematic circuit diagram illustrating a semiconductor device in accordance with an exemplary embodiment.

FIG. 6 is a schematic circuit diagram illustrating a semiconductor device 100c in accordance with an exemplary embodiment.

Referring to FIG. 6, the semiconductor device 100c includes an internal circuit 110, a power pad P_VDD, fuse circuits F1 to Fn, monitoring pads MP1 to MPn, auxiliary pads AP1 to APn, and connecting terminals SB1 to SBn.

Each of the fuse circuits F1 to Fn has a first terminal electrically connected to the internal circuit 110 through a first conductive line L11, L12, . . . , or L1n. Each of the monitoring pads MP1 to MPn is electrically connected to a second terminal of a respective one of the fuse circuits F1 to Fn through a second conductive line L21, L22, . . . , or L2n, and is used to test electrical characteristics of the internal circuit 110 before the semiconductor device 100c is packaged. The auxiliary pads AP1 to APn are electrically connected to the power pad P_VDD through a third conductive line L31, L32, . . . , L3n. The connecting terminals SB1 to SBn electrically connect each of the monitoring pads MP1 to MPn to a respective of the auxiliary pads AP1 to APn.

The fuse circuits F1 to Fn may be cut off, and the monitoring pads MP1 to MPn may be electrically disconnected from the internal circuit 110 during the packaging step of a semiconductor process.

In the example embodiment of FIG. 6, the power pad P_VDD may be a power supply pad to which a high supply voltage VDD is applied.

The semiconductor device 100c of FIG. 6 may further include a power pad P_VSS, electrically connected to the internal circuit 110, to which a low supply voltage VSS is applied, and pads PAD1 to PADn where signals are input or output.

The connecting terminal SB1 to SBn may be a conductive bump, a solder ball, a conductive spacer, or the like. The connecting terminals SB1 to SBn may be the same types of terminals as connecting terminals 30 of FIGS. 2 and 3.

In the example embodiment of FIG. 6, the fuse circuits F1 to Fn may be laser fuse circuits that are cut off by a laser means. However, in the semiconductor device 100c of FIG. 6, the monitoring pads MP1 to MPn may be electrically disconnected from the internal circuit 110 using the electric fuse circuits EF1 to EFn or the anti-fuse circuits AF1 to AFn, like the example embodiments of FIG. 4 and FIG. 5. The monitoring pads MP1 to MPn and the auxiliary pads AP1 to APn may be the same types of pads as monitoring pads MP1 to MPn and the auxiliary pads AP1 to APn as described and depicted in FIGS. 2 and 3.

In some embodiments, some of the auxiliary pads AP1 to APn may be connected to power pad P_VSS and others of the auxiliary pads AP1 to APn may be connected to power pad P_VDD. The number or proportion of auxiliary pads AP1 to APn connected to power pad P_VSS and power pad P_VDD may vary according to the use of the semiconductor device.

Figure 7:
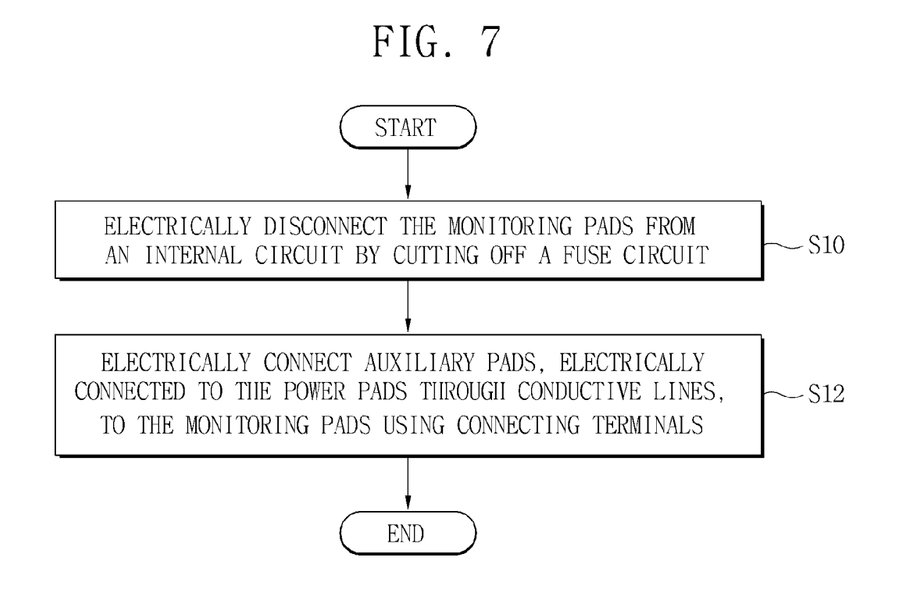
FIG. 7 is a flowchart illustrating a method of electrically connecting a monitoring pad to a power pad in accordance with an exemplary embodiment.

FIG. 7 is a flowchart illustrating a method of electrically connecting a monitoring pad to a power pad in accordance with an exemplary embodiment.

Referring to FIG. 7, a method of electrically connecting a monitoring pad to a power pad may include the following operations after the testing of the semiconductor chip on which the monitoring pad and power pad are disposed.

1) electrically disconnecting the monitoring pads from an internal circuit by opening a fuse circuit; (S10) and 2) electrically connecting auxiliary pads to the monitoring pads using connecting terminals, the auxiliary pads electrically connected to the power pads through conductive lines. (S12).

In the exemplary manufacturing method, step (1) may occur before or after step (2).

Figure 8:
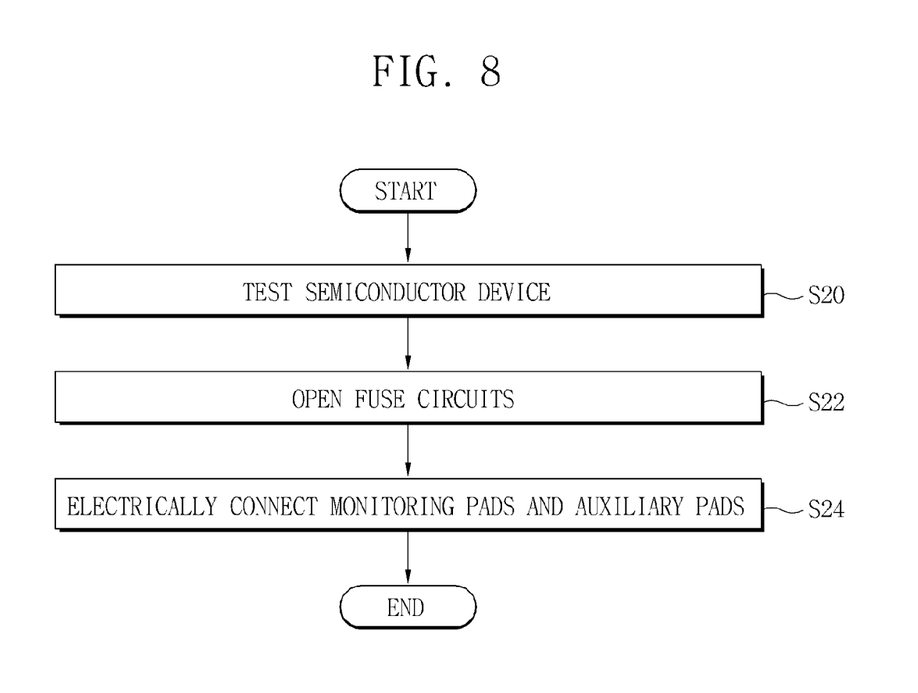
FIG. 8 is a flowchart illustrating a method of manufacturing a semiconductor device including the monitoring pad in accordance with an exemplary embodiment.

Referring to FIG. 8, an exemplary method of manufacturing a semiconductor device may include the following operations.

1) testing the semiconductor device using the monitoring pads connected to the internal circuit of the semiconductor device via fuse circuits; (S20)

2) after testing the semiconductor device, electrically disconnecting the monitoring pads from the internal circuit by opening the fuse circuits connecting the monitoring pads and the internal circuit; (S22) and 3) during packaging of the semiconductor device, electrically connecting the auxiliary pads to the monitoring pads using connection terminals. (S24)

In the exemplary manufacturing method, the auxiliary pads may be connected through conductive lines to power pads of the semiconductor device, such as P_VSS or P_VDD, and may be connected in that way prior to any of steps (1) through (3) above. In the exemplary manufacturing method, step (2) may occur before or after step (3). However, steps (2) and (3) may always occur after step (1).

In the method of electrically connecting a monitoring pad to a power pad in accordance with an exemplary embodiment, the monitoring pads may be electrically disconnected from the internal circuit using, for example, a laser fuse circuit, an electric fuse circuit or an anti-fuse circuit. The connecting terminals may be conductive bumps, solder balls, conductive spacers, or the like. The power pad may be a pad for connecting to a power source. For example, the power pad may be a ground pad to which a low supply voltage VSS is applied or a power supply pad to which a high supply voltage VDD is applied.

Embodiments may be applied to a semiconductor device, particularly to a semiconductor device including a monitoring pad. The semiconductor device may be, for example, a semiconductor chip, one or more semiconductor chips disposed on a substrate, or a semiconductor package containing one or more chips. The semiconductor device may be a single package or a package-on-package device. The semiconductor device may include one or more chips, and may include one or more chip stacks. The semiconductor device may be a memory device (e.g. it may include at least one semiconductor chip that acts as a memory chip), and/or it may be a logic device (e.g. it includes at least one semiconductor chip that acts as a logic chip, a processor, etc.). The semiconductor device could be part of a personal data assistant (PDA), smart phone, camera, LCD, computer, laptop, memory card, etc.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be construed by the broadest permissible interpretation of the following claims and their equivalents, and shall not be restricted or limited by the foregoing detailed description.

What is claimed is:

1. A method of manufacturing a semiconductor device, comprising:
    testing the semiconductor device using at least a first monitoring pad connected to an internal circuit of the semiconductor device;
    after testing the semiconductor device, electrically disconnecting the first monitoring pad from the internal circuit; and
    after testing the semiconductor device, electrically connecting at least a first auxiliary pad to the first monitoring pad with at least a first connecting terminal,
    wherein the first auxiliary pad is connected, through at least a first conductive line, to at least a first power pad of the semiconductor device.

2. The method of claim 1, wherein the step of electrically disconnecting the first monitoring pad from the internal circuit after testing the semiconductor device comprises:
    opening a fuse circuit disposed between the first monitoring pad and the internal circuit,
    wherein, prior to opening the fuse circuit, a first terminal of the fuse circuit is electrically connected to the internal circuit and a second terminal of the fuse circuit is electrically connected to the first monitoring pad.

3. The method of claim 2, wherein the fuse circuit is one of a laser fuse circuit, an electric fuse circuit, and an anti-fuse circuit.

4. The method of claim 1, wherein the first power pad is configured to supply power received from a high supply voltage source to the semiconductor device.

5. The method of claim 1, wherein the first power pad is configured to supply power received from a low supply voltage source to the semiconductor device.

6. The method of claim 1, wherein the first monitoring pad and the first auxiliary pad are disposed on an interlayer insulating film.

7. The method of claim 1, wherein the step of electrically connecting at least the first auxiliary pad to the first monitoring pad with at least the first connecting terminal comprises:
    providing the first connecting terminal over a surface-protecting film disposed over the first monitoring pad and the first auxiliary pad, the surface-protecting film configured to electrically separate the first monitoring pad and the first auxiliary pad,
    wherein a first portion of the first connecting terminal is electrically connected to the first monitoring pad and a second portion of the first connecting terminal is electrically connected to the first auxiliary pad.

8. A method of manufacturing a semiconductor device, comprising:
    testing a semiconductor chip using at least a first monitoring pad electrically connected to an internal circuit of the semiconductor chip via at least a first fuse circuit;
    after testing the semiconductor chip, electrically disconnecting the first monitoring pad from the internal circuit by opening the first fuse circuit; and
    after testing the semiconductor chip, electrically connecting at least a first auxiliary pad of the semiconductor chip to the first monitoring pad with at least a first conductive connector,
    wherein the first auxiliary pad is connected, through at least a first conductive line, to at least a first power pad of the semiconductor chip.

9. The method of claim 8, wherein, prior to opening the first fuse circuit, a first terminal of the first fuse circuit is electrically connected to the internal circuit and a second terminal of the first fuse circuit is electrically connected to the first monitoring pad.

10. The method of claim 8, wherein the first fuse circuit is one of a laser fuse circuit, an electric fuse circuit, and an anti-fuse circuit.

11. The method of claim 8, wherein the first monitoring pad and the first auxiliary pad are formed at the same time.

12. The method of claim 8, wherein the first monitoring pad and the first auxiliary pad are disposed on an interlayer insulating film.

13. The method of claim 8, wherein the step of electrically connecting at least a first auxiliary pad to the first monitoring pad with at least a first connecting terminal comprises:
    providing the first connecting terminal over a surface-protecting film disposed over the first monitoring pad and the first auxiliary pad, the surface-protecting film configured to electrically separate the first monitoring pad and the first auxiliary pad,
    wherein a first portion of the first connecting terminal is electrically connected to the first monitoring pad and the second portion of the first connecting terminal is electrically connected to the first auxiliary pad.

* * * * *